US012105274B2

(12) United States Patent
Thomas

(10) Patent No.: US 12,105,274 B2
(45) Date of Patent: Oct. 1, 2024

(54) NIGHT VISION EYEPIECE

(71) Applicant: Maranon, Inc., Eagle Rock, VA (US)

(72) Inventor: Nils I. Thomas, Eagle Rock, VA (US)

(73) Assignee: Maranon, Inc., Eagle Rock, VA (US)

( * ) Notice: Subject to any disclaimer, the term of this patent is extended or adjusted under 35 U.S.C. 154(b) by 229 days.

(21) Appl. No.: 16/803,412

(22) Filed: Feb. 27, 2020

(65) Prior Publication Data

US 2020/0301125 A1 Sep. 24, 2020

Related U.S. Application Data

(60) Provisional application No. 62/811,019, filed on Feb. 27, 2019.

(51) Int. Cl.
| | |
|---|---|
| *G02B 7/02* | (2021.01) |
| *G02B 7/04* | (2021.01) |
| *G02B 23/12* | (2006.01) |
| *G02B 23/16* | (2006.01) |
| *G02B 25/00* | (2006.01) |
| *H05K 9/00* | (2006.01) |

(52) U.S. Cl.
CPC ............... *G02B 23/16* (2013.01); *G02B 7/04* (2013.01); *G02B 23/12* (2013.01); *G02B 25/001* (2013.01); *H05K 9/0081* (2013.01)

(58) Field of Classification Search
CPC .......... G02B 23/12; G02B 23/16; G02B 7/04; G02B 25/001; G02B 7/20; G02B 7/00; G02B 7/004; G02B 7/008; G02B 7/02; G02B 7/021; G02B 7/022; G02B 7/023; G02B 7/026; G02B 7/028; G02B 23/00; H05K 9/0081

USPC .......... 359/511, 600–611, 694–706, 811–830
See application file for complete search history.

(56) References Cited

U.S. PATENT DOCUMENTS

| 3,888,568 A | 6/1975 | Norris et al. |
| 4,258,982 A | 3/1981 | Skinner et al. |
| 4,428,651 A * | 1/1984 | Calcutt .................. G02B 7/06 |
| | | 359/425 |

(Continued)

FOREIGN PATENT DOCUMENTS

| CN | 203561783 U | 4/2014 |
| CN | 108791777 | * 11/2018 |

(Continued)

OTHER PUBLICATIONS

International Preliminary Report on Patentability for application No. PCT/US2020/020129, issued from The International Bureau of WIPO on Sep. 10, 2021.

(Continued)

*Primary Examiner* — Thong Q Nguyen
(74) *Attorney, Agent, or Firm* — Charles S. Sara; Elizabeth L. Neal; DeWitt LLP

(57) ABSTRACT

The present invention is a lightweight lens cell assembly forming a nightvision eyepiece. The lens cell has an integral focusing mechanism and at least one lens element manufactured from a polymer. Because the lens cell is manufactured from a material thermally matched to the polymer and the lens element is integrally connected to the lens cell or connected to the lens cell by an interference fit, the assembly provides significant benefits to both weight and error reduction.

18 Claims, 4 Drawing Sheets

(56) References Cited

U.S. PATENT DOCUMENTS

| | | | | |
|---|---|---|---|---|
| 5,052,782 | A | * | 10/1991 | Myer .................... G02B 7/026 359/830 |
| 5,274,456 | A | | 12/1993 | Izumi et al. |
| 5,784,207 | A | * | 7/1998 | Satoh .................. G02B 25/001 359/701 |
| 5,835,289 | A | * | 11/1998 | Berry .................... G02C 7/08 359/822 |
| 6,590,720 | B2 | * | 7/2003 | Oba .................... H04N 5/2254 359/822 |
| 6,816,324 | B2 | * | 11/2004 | Jang .................... H04N 9/3141 348/E5.143 |
| 8,491,748 | B1 | | 7/2013 | Lai |
| 8,526,129 | B2 | * | 9/2013 | Hirata .................. G02B 7/021 359/819 |
| 8,556,106 | B1 | * | 10/2013 | Bayat ................ B65D 43/0229 220/259.3 |
| 8,931,992 | B2 | * | 1/2015 | Seiter .................... G03B 17/14 396/533 |
| 11,181,712 | B2 | * | 11/2021 | Li .......................... G02B 7/022 |
| 2003/0137746 | A1 | | 7/2003 | Kitaoka et al. |
| 2005/0104995 | A1 | | 5/2005 | Spryshak et al. |
| 2006/0098307 | A1 | * | 5/2006 | Campean .............. G02B 23/16 359/819 |
| 2008/0084619 | A1 | | 4/2008 | Lee |
| 2010/0322610 | A1 | | 12/2010 | Lusinchi |
| 2011/0096424 | A1 | | 4/2011 | Lee et al. |
| 2015/0112137 | A1 | | 4/2015 | Hogrefe et al. |
| 2015/0131175 | A1 | | 5/2015 | Lamontagne et al. |
| 2016/0124290 | A1 | | 5/2016 | Bergreen et al. |
| 2017/0223245 | A1 | * | 8/2017 | Park ...................... H04N 23/51 |
| 2017/0320292 | A1 | * | 11/2017 | Isoda ...................... B32B 27/08 |
| 2018/0321457 | A1 | | 11/2018 | Symmons et al. |

FOREIGN PATENT DOCUMENTS

| | | | |
|---|---|---|---|
| DE | 10 2007 004343 | * | 9/2012 |
| JP | 60-163009 S | | 8/1985 |
| JP | 06-160685 H | | 6/1994 |
| JP | 2000139819 A | | 5/2000 |
| JP | 2004-233483 A | | 8/2004 |
| JP | 2012-254538 A | | 12/2012 |

OTHER PUBLICATIONS

International Search Report and Written Opinion for PCT/US2020/020129 dated Aug. 31, 2020.
Extended European Search Report issued Oct. 10, 2022, in connection with the corresponding EP Application No. 20766422.8 from the European Patent Office.
Search Report and Written Opinion issued Aug. 28, 2023, from the SG Patent Office, in connection with corresponding Singaporean application No. 11202108862Q.
Examination Report issued Jan. 5, 2004, from the Canadian Patent Office in connection with related CA Patent Application No. 3,130,787.
Office action issued Sep. 26, 2023, from the JP Patent Office, in connection with corresponding Japanese application No. 2021-549898.
European Office Action received in European Patent Application 20766422.8, mailed on Feb. 28, 2024, 5 pages.
Israel Office Action received in Israel Patent Application 285885, mailed on Mar. 7, 2024, 4 pages.

* cited by examiner

NIGHT VISION EYEPIECE

CROSS-REFERENCE TO RELATED APPLICATIONS

This application claims the benefit of prior-filed, U.S. Provisional Patent Application No. 62/811,019, filed on Feb. 27, 2019, the contents of which are incorporated herein by reference in their entirety.

BACKGROUND OF THE INVENTION

The present application is directed to the field of imaging. More specifically, the present application is directed to the field of military and commercial night vision devices, and an improved eyepiece therefor.

Night vision goggles have generally been locked in an architecture that results in a heavy product. When mounted on the human head the result is physiological neck strain, pain, loss of attentiveness, and potential injury. A major component of the goggle weight is the lenses, in particular the eyepiece.

Prior art eyepieces frequently consist of a lens cell, focus mechanisms, collimation adjustment features, electro-magnetic interference (EMI) filtering, and environmental seal mechanisms, usually assembled in two to three components. Eyepieces can be heavy as they are normally made of glass lens elements and metal subcomponents such as aluminum cells and spacers. Additionally, when the lens is assembled into the goggle there are other mechanical features such as focus rings, stops, seals, etc. which add weight.

Additionally, in binocular systems, the eyepiece adds weight due to its misalignment of the optical components to the focus mechanisms. Since this misalignment occurs in each eyepiece when two eyepieces are assembled in the two channels of a binocular, the resultant images presented to the eye are misaligned. At the goggle level, this defect is called "collimation" errors. Ideally each channel would be collimated to look at the same point in space and project it faithfully to the human eyes; that is the image would like identical to the person as if the person were looking without the aid of the goggle. To correct such errors the goggle needs additional mechanical pieces to adjust or shift optical components so both channels are optically collimated properly. These mechanisms add weight and cost to the product.

Furthermore, previous eyepiece assemblies have numerous components with relatively large tolerances. These tolerances often force the optical designer to either add lens elements, change glass types to heavier types, or add manufacturing steps to adjust for these tolerances. Usually the lens cell is made to have a clearance fit to the lens; often called a slip fit. As such the lens internal diameter is larger than outer diameter of the lens element; consequentially the lens element can move side to side. This side to side movement is a tolerance error the lens design needs to account for and often results in the lens designer needing to make tight tolerances in the design or add more elements. Lenses also have clearance fits because glass tends to chip under stress; in prior art assemblies, where the lens cell is metal, press fitting causes high stress and chipping. Lens designs with plastic elements have assumed clearance fits, as most have been installed in materials that are not thermally matched to the plastic. Thus, when the temperature of the lens changes, stress is introduced into the lens and optical performance suffers. Finally, when a precise fit is required by the lens design, the usual solution is to make a clearance fit and move the lens elements in relation to each other, then glue them in place with the lenses are properly aligned. All such changes tend to add weight, impact performance, and add cost.

Moreover, prior art spacers are independent pieces that are inserted in between the lens elements and the interior diameter of the cell and a centering feature on the lens. Independent spacers are clearance fit and introduce centering, tilt, and spacing errors. Spacers introduce centering errors as the gaps between the parts need to be larger than the manufacturing errors of the lens cell and lens elements. Spacing errors occur due to the accumulated error of the lens elements being separated and the spacer itself. Tilt errors occur because spacers are disposed on curved surfaces which they tend to follow on assembly; the parts rotate about each other similarly to a ball and socket joint. Another consequence is additional weight is added as the lens diameters are made slightly larger to sit on the spacer.

There is an unmet need for an eyepiece assembly which is lightweight, has fewer collimation errors, and allows the optical designer apply looser tolerances to the lens prescription.

BRIEF SUMMARY

An embodiment of the present invention is a lens cell assembly comprising a lens cell and at least one lens element manufactured from a polymer. The lens cell includes an integral focusing mechanism and at least one sealing feature extending around an outer circumference of the lens cell. The lens cell is manufactured from a material thermally matched to the polymer.

The objects and advantages of the invention will appear more fully from the following detailed description of the embodiments of the invention and examples.

BRIEF DESCRIPTION OF THE DRAWING(S)

DETAILED DESCRIPTION

In the present description, certain terms have been used for brevity, clearness and understanding. No unnecessary limitations are to be applied therefrom beyond the requirement of the prior art because such terms are used for descriptive purposes only and are intended to be broadly construed. The different systems and methods described herein may be used alone or in combination with other systems and methods. Various equivalents, alternatives and modifications are possible within the scope of the appended claims. Each limitation in the appended claims is intended to invoke interpretation under 35 U.S.C. § 112, sixth paragraph, only if the terms "means for" or "step for" are explicitly recited in the respective limitation.

Figure 1A:
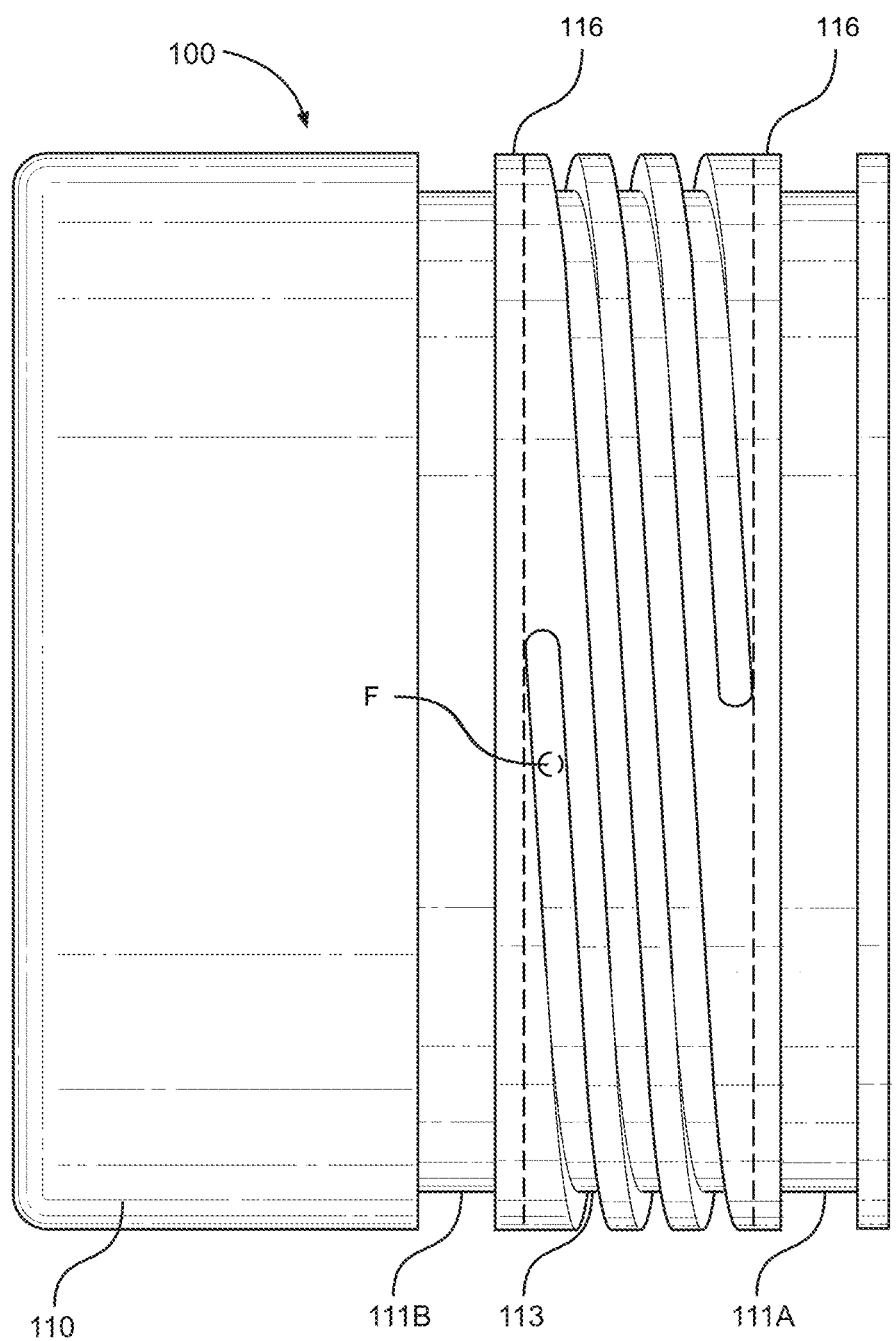
FIGS. 1A and 1B depict perspective and side cross-sectional views, respectively, of an exemplary embodiment of a lens cell assembly.
Figure 1B:
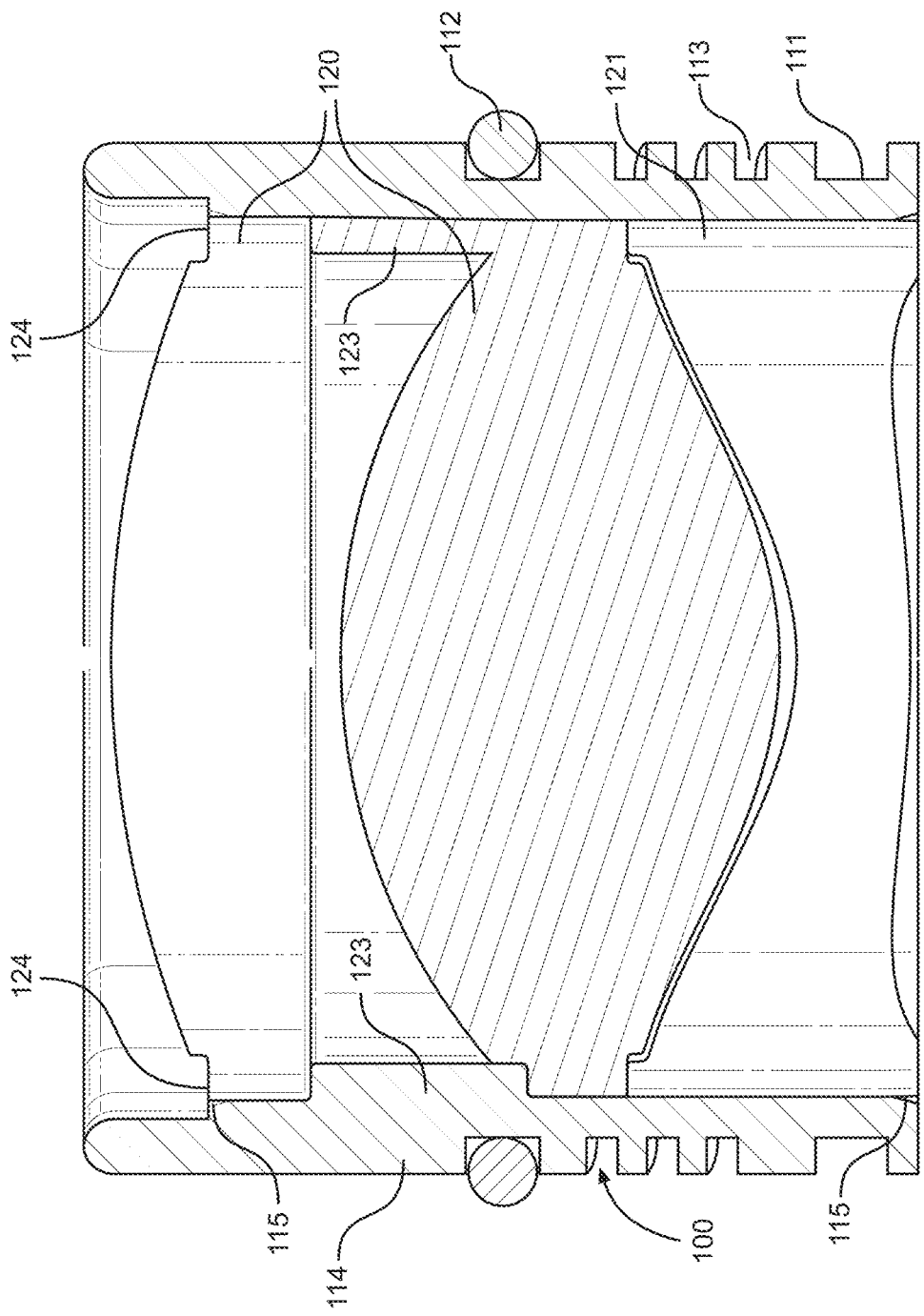

The assembly 100 shown in FIGS. 1A and 1B includes a lens cell 110 that combines functional features from other components to eliminate certain centering and tilt tolerances as a result of manufacture. The assembly 100 also includes an all-plastic lens design for reduced weight, and lens spacing features that reduce if not eliminate spacing tolerances.

The lens cell 110 combines at least one sealing feature 111, focus stop, and focus thread grooves 113 into a single functional element that is manufactured out of a light weight plastic. At least one sealing feature 111 is located on an outer circumference of the lens cell 110. In the exemplary embodiment, the at least one sealing feature 111 comprises two seal glands. In the exemplary embodiment, the sealing features 111 are located at distal (111A) and mid-range (111B) points on the lens cell 110, though other embodiments may include different locations or numbers of sealing features 111, such as, but not limited to, one or three sealing features 111.

The sealing feature 111 is a groove which holds at least one circular spring 112 in place on the lens cell 110. In the exemplary embodiment, the circular springs 112 are elastomeric O-rings; however, it should be noted that the scope of the invention is to be understood to encompass any circular spring mechanism. When the circular spring 112 is inserted into the sealing feature 111, the circular spring 112 acts as a uniform circular spring mechanism to center the lens cell assembly 100 inside a mating body in a monocular (not shown). This eliminates centering tolerances between the monocular and lens cell assembly 100 thus facilitating improved collimation. The two circular springs 112 spaced along the lens cell 110 of the exemplary embodiment also prevent tilt misalignments.

The sealing feature 111 also acts as a focus stop. When focusing the lens cell assembly 100, the lens cell 110 has an integral focusing mechanism. The lens cell 110 essentially functions as a barrel cam with thread grooves 113 extending at a particular pitch adjacent to the sealing feature 111. A monocular assembly in a night vision device includes at least one focusing follower F extending into the thread grooves 113 of the lens cell assembly 100. As a result, rotation of the lens cell assembly 100 relative to the monocular assembly causes the lens cell assembly 100 to move linearly forward or backward relative to the monocular assembly for focusing the lens cell assembly 100. When the focusing follower F meets an interior wall 116 of the sealing feature 111, it cannot move further, stopping rotation and linear motion of the lens cell assembly 100 in the direction of the sealing feature 111. While the exemplary embodiment includes a three-start thread, depending on the configuration of the monocular assembly and focusing follower F, the thread grooves 113 may number between one and four starts to allow for variations in placement and adjustment speed of the lens cell assembly 100.

The sealing feature 111 also provides mechanical rigidity to the lens cell assembly 100. As seen in FIG. 1B, the lens cell walls 114 are thin as part of stress mitigation for the lens cell assembly 100. Both the sealing feature 111 as well the thread grooves 113 provide additional mechanical rigidity to the thin lens cell walls 114 of the lens cell 110. Thus, the overall lens cell assembly 100 can have thin lens cell walls 114 reducing weight, while the rigidity provides resistance to shear stress that result from the torque of turning the lens cell assembly 100 to focus.

The assembly 100 also includes a first lens element 120 and an optional second lens element 121. Additional lens elements may be added to the lens cell assembly 100 as necessary. It should be understood that the term "lens element" may encompass a single lens element or a combination of multiple lens elements, and that any structural element discussed herein as part of the first lens element 120 may also be incorporated into the second lens element 121 and/or any additional lens elements. The dimensions of the lens cell 110 are set such that at least one of the first lens element 120 and the second lens element 121 has an interference fit (also called a press fit) into the lens cell 110. This eliminates the previously required centering tolerances, as mentioned above, since the lens can be press-fit directly into the lens cell 110. In certain embodiments, the first lens element 120 and/or the second lens element 121 also include at least one sealant groove 124 for accepting sealant between the edge of the first lens element 120 and/or the second lens element 121 and the lens cell walls 114.

Cell chamfers 115 in the lens cell 110 aid in insertion of the first lens element 120 and/or the second lens element 121 during the press fit operation. Furthermore, because the lens cell 110, the first lens element 120, and the second lens element 121 are plastic, the risk of chipping glass is eliminated. Thermally matching the plastics of the lens cell 110, the first lens element 120, and the second lens element 121 eliminates stresses due to temperature change because the components will have similar thermal expansion coefficients. Removing any gaps between the lens cell 110 and the first and second lens elements 120 and 121 automatically axially aligns the first and second lens elements 120 and 121.

The interference fit itself has a tendency to eliminate tilt errors between lens elements by its nature, that is, because two cylinders are being forced to have the same interface surface. Thus, their axes are forced to be parallel. While this natural tendency does occur, if the first lens element 120 is started at an angle relative to the lens cell 110 then there will be a residual tilt. That is, not all of the initial misalignment is removed. To make the system self-correcting, the edges of the first lens element 120 may have edge channels 122 to make the lens edge in the form of a piston. Because there is less contact area between the first lens element 120 and lens cell 110, the first lens element 120 will require less pressing force to correct itself. By making the ends that contact the lens cell 110 a large distance apart any residual tilt is greatly reduced because contact with the lens cell 110 is over a large distance. Edge channels 122 may be incorporated into the second lens element 121 as well as any additional lens elements.

In certain embodiments, at least one of the first lens element 120 and the second lens element 121 is molded simultaneously with the lens cell 110 to form an at least partially integral lens cell assembly 100. In other embodiments, the lens cell 110 is overmolded onto at least one of the first lens element 120 and the second lens element 121 after formation of the at least one of the first lens element 120 or the second lens element 121 to form an at least partially integral lens cell assembly 100.

The assembly 100 includes integral spacers 123 to space the first lens element 120 and the second lens element 121 to the proper distance from each other, if more than one lens is used. Because the spacers 123 are integral with the lens cell 110 and/or the first and/or second lens element 120 and/or 121, tilt and centering errors are reduced if not eliminated, as the spacer 123 is not able to rotate about a surface of the first lens element 120 and/or the second lens element 121 and there are no gaps between components. Furthermore, by machining a spacer 123 directly into the lens cell 110 and/or the first and/or second lens element 120 and/or 121 a variable in spacing error is eliminated. Spacing errors are a buildup of the spacer error, and the thickness error of each lens element. By using an integral spacer 123 machined at the same time as the lens cell 110 and/or the first and/or second lens element 120 and/or 121, the spacer error is eliminated. These error reductions allow additional latitude for a lens designer to design the lens elements for performance and manufacturability.

An electrically conductive material may be coated onto the lens cell 110, the first lens element 120 and/or the second lens element 121 for electromagnetic interference (EMI) shielding. Electrical contact may be made with the monocular assembly via the focusing follower. The conductive material may be deposited in two ways. It can be selectively deposited so that interior of the lens cell 110 is black and not visible, or the interior of the lens cell 110 may be completely coated and black coatings placed on the edges of the first lens element 120 and/or the second lens element 121. Deposition methods may be evaporation or sputtering or any other method that a designer or manufacturing concern may require. If additional EMI shielding is required, then the first lens element 120 and/or the second lens element 121 may be coated with a transparent electrically conductive material. An electrical connection to the lens cell 110 is then made by physical contact of the first lens element 120 and/or the second lens element 121 to the integral spacer 123. The electrically conductive material may include, but is not limited to, indium tin oxide or an equivalent transparent electrically conductive material. The first lens element 120 and/or the second lens element 121 may otherwise be all plastic to reduce weight. In certain embodiments, the first lens element 120 and/or the second lens element 121 may include two diffractive surfaces.

Optionally, in certain embodiments the design of the first lens element 120 and/or the second lens element 121 may also utilize features intended to further reduce weight in the lens cell assembly 100. The first lens element 120 may be disposed as close as possible to an imaging surface of a monocular. By placing the first lens element 120 close to the imaging surface, light does not spread in as large of diameter allowing reduction of the diameter of first lens element 120. The first lens element 120 may have a high index of refraction. By using a high index of refraction, the light rays are more tightly bent toward the axis diameter, allowing reduction of the diameter of first lens element 120. Additional lens elements, such as the second lens element 121, are used for color correction and correction of distortion. The first lens element 120 and/or the second lens element 121 may also have aspherical curves.

One risk in the new art is stress altering optical properties of lens elements. Interference fits by nature apply stress to either the item being pressed, the item being pressed into, or both items. Even rotation of the lens cell assembly 100 during focusing may cause stress. In such a case the lens element, lens cell, or both may be subjected to increased stress. Stresses in plastic lens elements can reduce the optical performance of a lens by altering the lens shape.

The present eyepiece mitigates against stress in three ways. First, the lens cell walls 114 are thin. The thin lens cell walls 114 takes on more stress than the first and/or second lens elements 120 and/or 121. In the vernacular, the lens cell 110 stretches but the first and/or second lens elements 120 and/or 121 do not. Second, the sealant groove 124 gives space for the plastic of the edge of the first and/or second lens elements 120 and/or 121 to move; as a result, stress is directed to the edge and not into the optical area of the first and/or second lens elements 120 and/or 121 by deformation of the edge. Third, the material of the lens cell 110 is chosen to be thermally matched to the material of the first and/or second lens elements 120 and/or 121. In one embodiment the lens cell 110 is of the same material as the first and second lens elements 120 and 121.

Figure 2A:
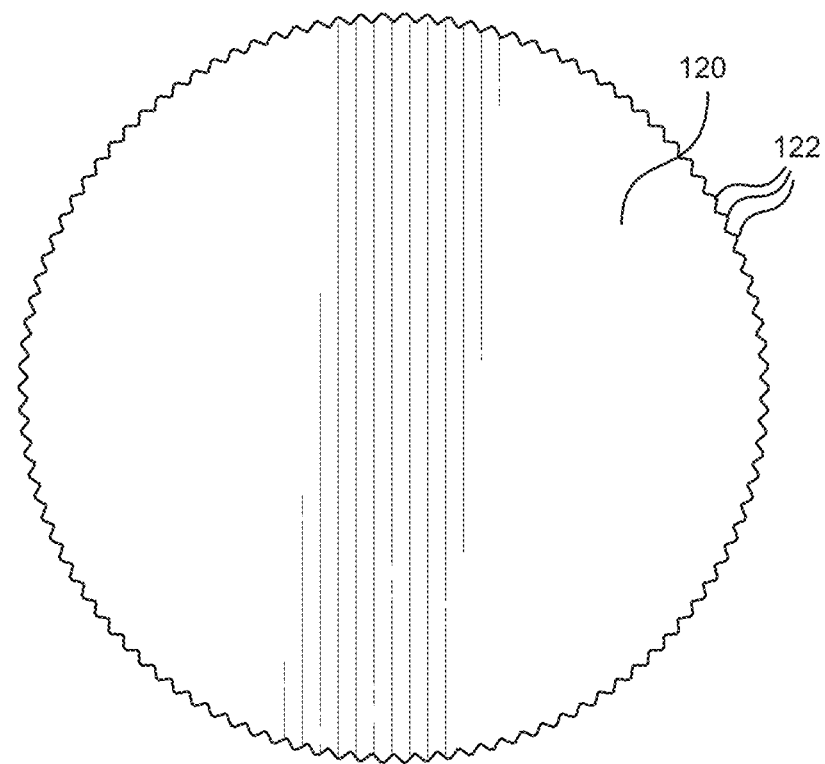
FIGS. 2A and 2B depict front and side views, respectively, of an exemplary embodiment of a lens element used in an exemplary embodiment of a lens cell assembly.
Figure 2B:
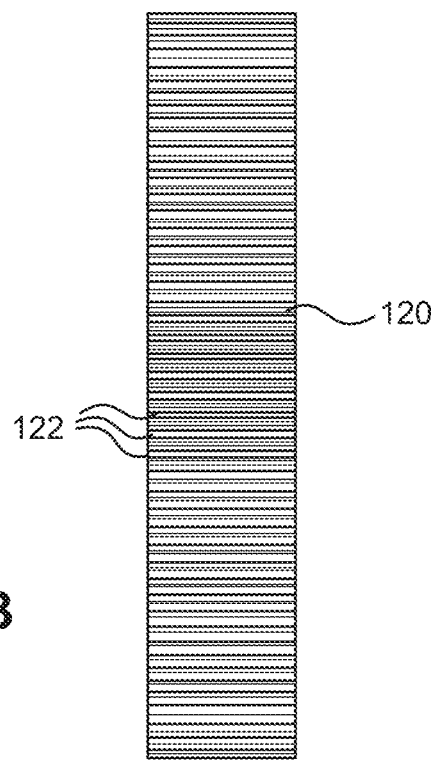
Figure 2C:
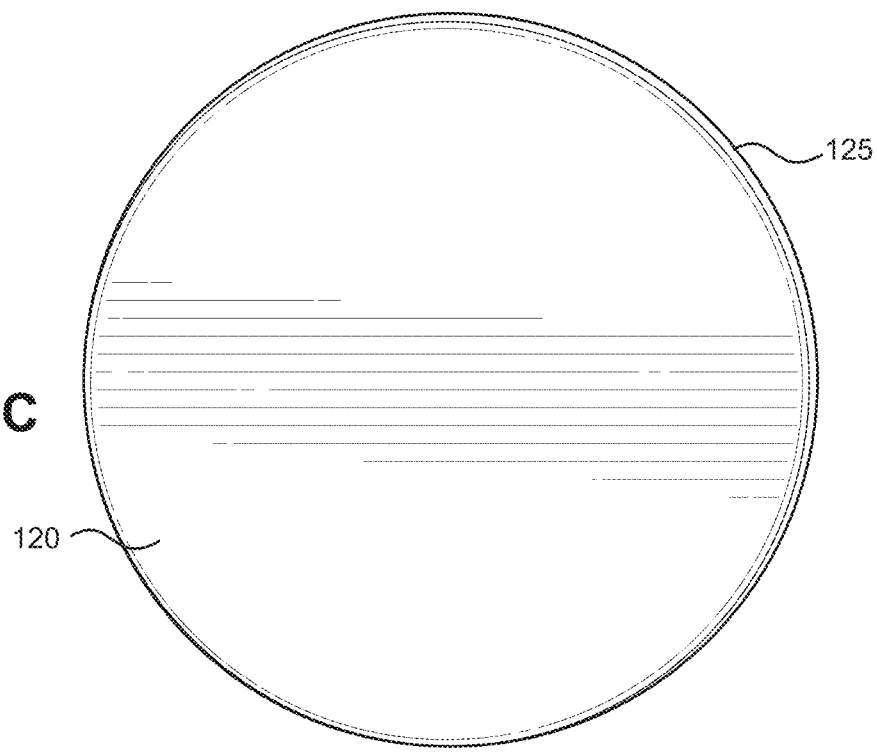
FIGS. 2C and 2D depict front and side views, respectively, of another exemplary embodiment of a lens element used in an exemplary embodiment of a lens cell assembly.
Figure 2D:
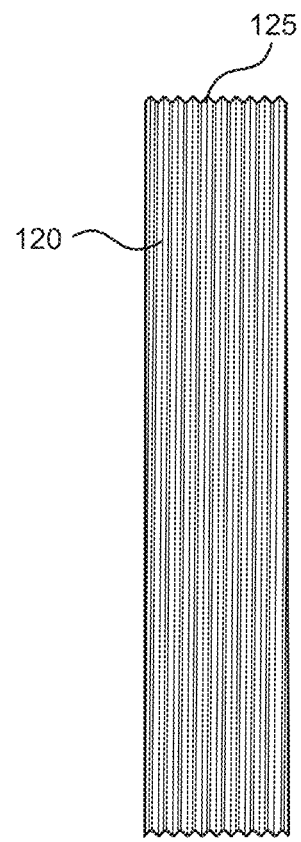

As shown in FIGS. 2A and 2B, the edges of the first and/or second lens elements 120 and/or 121 can include edge channels 122 to provide further stress relief by serving as stress relief pockets. In certain embodiments, the first lens element 120 and/or the second lens element 121 may include at least one edge thread 125 extending along an outer periphery of the first lens element 120 and/or the second lens element 121, as shown in FIGS. 2C and 2D. The at least one edge thread 125 interacts with a complementary structure in the lens cell 110 to hold the first and/or second lens element 120 and/or 121 in place.

It should be understood that in place of the above lens element design(s), other lens element designs may be used in conjunction with the disclosed lens cell 110. It should also be understood that any of the above features may be used in combination with any other disclosed feature or features, or in combination with a different lens element design.

In the foregoing description, certain terms have been used for brevity, clearness, and understanding. No unnecessary limitations are to be inferred therefrom beyond the requirement of the prior art because such terms are used for descriptive purposes and are intended to be broadly construed. The different configurations, systems, and method steps described herein may be used alone or in combination with other configurations, systems and method steps. It is to be expected that various equivalents, alternatives and modifications are possible within the scope of the appended claims.

What is claimed is:

1. An assembly comprising:
a monocular having a focusing follower;
a lens cell having an integral focusing mechanism and at least one sealing feature extending around an outer circumference of the lens cell,
wherein the at least one sealing feature comprises a plurality of seal glands spaced along the outer circumference of the lens cell,
wherein at least one of the plurality of seal glands is a focus stop such that the focusing follower travelling along the integral focusing mechanism is prevented from movement upon meeting an interior wall of the at least one sealing feature,
wherein at least one circular spring of a plurality of circular springs is located within at least one seal gland of the plurality of seal glands; and
at least one lens element manufactured from a polymer,
wherein the lens cell is manufactured from a material thermally matched to the polymer,
wherein the thermal matching causes the lens cell and the polymer to have similar thermal expansion coefficients to prevent stresses due to temperature change.

2. The assembly of claim 1, wherein the integral focusing mechanism is a thread groove.

3. The assembly of claim 2, wherein the thread groove is a three-start thread.

4. The assembly of claim 1, wherein the material is the polymer.

5. The assembly of claim 1, wherein the plurality of circular springs comprises a plurality of elastomeric O-rings.

6. The assembly of claim 1, wherein the lens cell further comprises at least one chamfer located on an inner lens cell wall.

7. The assembly of claim 1, wherein the lens cell assembly further comprises a conductive coating deposited on a surface of the lens cell for facilitating electromagnetic interference (EMI) protection.

8. The assembly of claim 1, wherein the lens cell assembly further comprises a transparent conductive coating deposited on a surface of the at least one lens element for facilitating EMI protection.

9. The assembly of claim 1, wherein the at least one lens element further comprises at least one diffractive surface.

10. The assembly of claim 1, wherein the at least one lens element further comprises at least one aspherical surface.

11. The assembly of claim 1, wherein the at least one lens element further comprises at least one sealant groove located on an outer periphery of the at least one lens element.

12. The assembly of claim 1, wherein the at least one lens element further comprises at least one edge channel located on an outer periphery of the at least one lens element.

13. The assembly of claim 1, wherein at least one of the lens cell and the at least one lens element further comprises at least one integral spacer.

14. The assembly of claim 1, wherein the at least one lens element further comprises at least one edge thread extending along an outer periphery of the at least one lens element.

15. The assembly of claim 1, wherein the at least one lens element is connected to the lens cell by an interference fit.

16. The assembly of claim 1, wherein the at least one lens element is integrally connected to the lens cell.

17. The assembly of claim 16, wherein at least one lens element is molded simultaneously with the lens cell.

18. The assembly of claim 16, wherein the lens cell is overmolded onto the at least one lens element after formation of the at least one lens element.

\* \* \* \* \*